(12) United States Patent
Yang

(10) Patent No.: US 11,937,442 B2
(45) Date of Patent: Mar. 19, 2024

(54) FLEXIBLE SUBSTRATE, PREPARATION METHOD THEREFOR AND FLEXIBLE DISPLAY SUBSTRATE

(71) Applicant: BOE Technology Group Co., Ltd., Beijing (CN)

(72) Inventor: Jing Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 388 days.

(21) Appl. No.: 17/435,032

(22) PCT Filed: Feb. 7, 2021

(86) PCT No.: PCT/CN2021/075717
§ 371 (c)(1),
(2) Date: Aug. 30, 2021

(87) PCT Pub. No.: WO2021/160056
PCT Pub. Date: Aug. 19, 2021

(65) Prior Publication Data
US 2022/0140280 A1 May 5, 2022

(30) Foreign Application Priority Data
Feb. 14, 2020 (CN) .......................... 202010092387.3

(51) Int. Cl.
*H10K 50/84* (2023.01)
*H10K 59/12* (2023.01)
(Continued)

(52) U.S. Cl.
CPC ............. *H10K 50/84* (2023.02); *H10K 59/12* (2023.02); *H10K 71/00* (2023.02); *H10K 77/111* (2023.02);
(Continued)

(58) Field of Classification Search
CPC ........ H10K 50/84; H10K 59/12; H10K 71/00; H10K 2102/311
See application file for complete search history.

(56) References Cited

U.S. PATENT DOCUMENTS

2006/0270191 A1 11/2006 Tamura et al.
2018/0046221 A1* 2/2018 Choi ...................... H05B 33/22
(Continued)

FOREIGN PATENT DOCUMENTS

| CN | 1873915 A | 12/2006 |
|---|---|---|
| CN | 109509769 A | 3/2019 |

(Continued)

OTHER PUBLICATIONS

International Search Report for PCT/CN2021/075717 dated May 12, 2021.

*Primary Examiner* — Syed I Gheyas
(74) *Attorney, Agent, or Firm* — Ling Wu; Stephen Yang; Ling and Yang Intellectual Property

(57) ABSTRACT

A flexible substrate, a preparation method therefor and a flexible display substrate. The flexible substrate comprises a plurality of spaced island regions and a plurality of bridge regions connected between different island regions, and has a plurality of openings in non-island regions and non-bridge regions. Each island region is provided with a plurality of layered structures. Each layered structure comprises, sequentially arranged from bottom to top: a first flexible base layer, a first buffer layer and a second flexible base layer, wherein the orthographic projection of the surface of the side of the first buffer layer facing the first flexible base layer on the first flexible base layer is greater than that of the surface of the side of the first flexible base layer facing the first buffer layer on the first flexible base layer.

20 Claims, 11 Drawing Sheets

(51) Int. Cl.
*H10K 71/00* (2023.01)
*H10K 77/10* (2023.01)
*H10K 102/00* (2023.01)

(52) U.S. Cl.
CPC .... *H10K 59/1201* (2023.02); *H10K 2102/311* (2023.02)

(56) References Cited

U.S. PATENT DOCUMENTS

| | | |
|---|---|---|
| 2019/0081273 A1 | 3/2019 | Sung et al. |
| 2019/0189963 A1 | 6/2019 | Lee et al. |
| 2019/0245160 A1 | 8/2019 | Yoon et al. |
| 2021/0257434 A1 | 8/2021 | Xie et al. |

FOREIGN PATENT DOCUMENTS

| | | | | |
|---|---|---|---|---|
| CN | 109935730 A | | 6/2019 | |
| CN | 110120403 A | | 8/2019 | |
| CN | 110289292 A | * | 9/2019 | ........... G06F 1/1652 |
| CN | 110767090 A | | 2/2020 | |

* cited by examiner

```
┌─────────────────────────────────────────────────────────────┐
│ Sequentially form a first flexible base substrate layer and a first │
│ buffer layer on a rigid underlaying substrate, and form a first via │ ─── 101
│ hole on the first buffer layer                                      │
└─────────────────────────────────────────────────────────────┘
                              │
                              ▼
┌─────────────────────────────────────────────────────────────┐
│ Process the first flexible base substrate layer to make the first via │
│ hole penetrate through the first flexible base substrate layer, and an│
│ orthographic projection of a surface of the first buffer layer facing │
│ the first flexible base substrate layer on the rigid underlaying      │ ─── 102
│ substrate is larger than that of a surface of the first flexible base │
│ substrate layer facing the first buffer layer on the rigid underlaying│
│ substrate                                                             │
└─────────────────────────────────────────────────────────────┘
                              │
                              ▼
┌─────────────────────────────────────────────────────────────┐
│ Form a second flexible base substrate layer on a side of the first    │ ─── 103
│ buffer layer away from the first flexible base substrate layer        │
└─────────────────────────────────────────────────────────────┘
                              │
                              ▼
┌─────────────────────────────────────────────────────────────┐
│ Process the second flexible base substrate layer to make the first via│ ─── 104
│ hole penetrate through the second flexible base substrate layer       │
└─────────────────────────────────────────────────────────────┘
                              │
                              ▼
┌─────────────────────────────────────────────────────────────┐
│ Lift off the rigid underlaying substrate to obtain the flexible       │ ─── 105
│ substrate                                                             │
└─────────────────────────────────────────────────────────────┘
```

FIG. 1

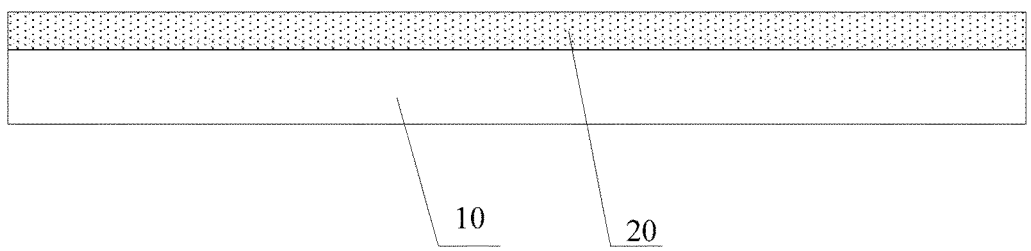

FIG. 2

```
┌─────────────────────────────────────────────────────────────┐
│ Sequentially form a first flexible base substrate layer and a first │
│ buffer layer on a rigid underlaying substrate, and form a first via │──801
│ hole on the first buffer layer                              │
└─────────────────────────────────────────────────────────────┘
                              ▼
┌─────────────────────────────────────────────────────────────┐
│ Process the first flexible base substrate layer to make the first via │
│ hole penetrate through the first flexible base substrate layer, and an │
│ orthographic projection of a surface of the first buffer layer facing │
│ the first flexible base substrate layer on the rigid underlaying │──802
│ substrate is larger than that of a surface of the first flexible base │
│ substrate layer facing the first buffer layer on the rigid underlaying │
│ substrate                                                   │
└─────────────────────────────────────────────────────────────┘
                              ▼
┌─────────────────────────────────────────────────────────────┐
│ Form a second flexible base substrate layer on a side of the first │──803
│ buffer layer away from the first flexible base substrate layer │
└─────────────────────────────────────────────────────────────┘
                              ▼
┌─────────────────────────────────────────────────────────────┐
│ Form a second buffer layer on a side of the second flexible base │
│ substrate layer away from the first buffer layer, and form a second │──804
│ via hole having a position corresponding to that of the first via hole │
│ on the second buffer layer                                  │
└─────────────────────────────────────────────────────────────┘
                              ▼
┌─────────────────────────────────────────────────────────────┐
│ Process the second flexible base substrate layer to make the first via │
│ hole and the second via hole communicated with each other and │
│ penetrate through the second flexible base substrate layer, and an │
│ orthographic projection of a surface of the second buffer layer │──805
│ facing the second flexible base substrate layer on the rigid │
│ underlaying substrate is larger than that of a surface of the second │
│ flexible base substrate layer facing the second buffer layer on the │
│ rigid underlaying substrate                                 │
└─────────────────────────────────────────────────────────────┘
                              ▼
┌─────────────────────────────────────────────────────────────┐
│ Form a third flexible base substrate layer on a side of the second │──806
│ buffer layer away from the second flexible base substrate layer │
└─────────────────────────────────────────────────────────────┘
                              ▼
┌─────────────────────────────────────────────────────────────┐
│ Process the third flexible base substrate layer to make the first via │
│ hole and the second via hole communicated with each other and │──807
│ penetrate through the third flexible base substrate layer   │
└─────────────────────────────────────────────────────────────┘
                              ▼
┌─────────────────────────────────────────────────────────────┐
│ Lift off the rigid underlaying substrate to obtain the flexible │──808
│ substrate                                                   │
└─────────────────────────────────────────────────────────────┘
```

FIG. 8

| Sequentially form a first flexible base substrate layer and a first buffer layer on a rigid underlaying substrate, and form a first via hole on the first buffer layer | ～1401 |

↓

| Process the first flexible base substrate layer to make the first via hole penetrate through the first flexible base substrate layer, and an orthographic projection of a surface of the first buffer layer facing the first flexible base substrate layer on the rigid underlaying substrate is larger than that of a surface of the first flexible base substrate layer facing the first buffer layer on the rigid underlaying substrate | ～1402 |

↓

| Form a second flexible base substrate layer on a side of the first buffer layer away from the first flexible base substrate layer | ～1403 |

↓

| Form a thin film transistor layer on a side of the second flexible base substrate layer away from the first buffer layer, and form a third via hole having a position corresponding to that of the first via hole on the thin film transistor layer | ～1404 |

↓

| Process the second flexible base substrate layer to make the first via hole and the third via hole communicated with each other and penetrate through the first flexible base substrate layer and the second flexible base substrate layer | ～1405 |

↓

| Sequentially form an organic light emitting layer and an encapsulation thin film layer on the thin film transistor layer | ～1406 |

↓

| Lift off the rigid underlaying substrate to obtain a flexible display substrate | ～1407 |

FIG. 14

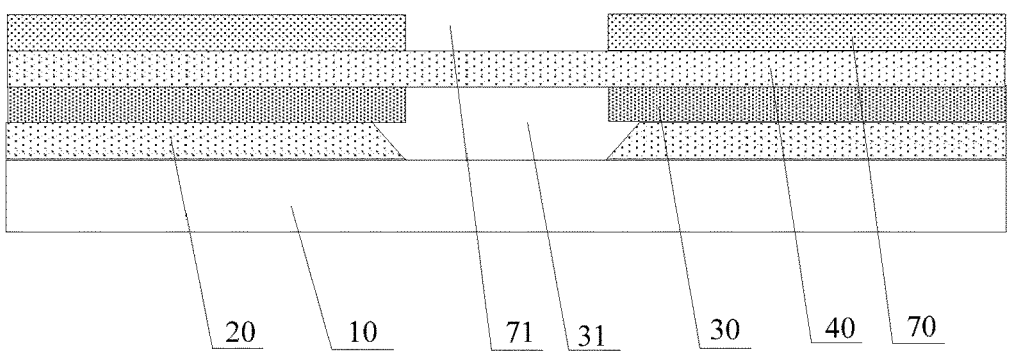

FIG. 15

| Sequentially form a first flexible base substrate layer and a first buffer layer on a rigid underlaying substrate, and form a first via hole on the first buffer layer | — 2001 |

↓

| Process the first flexible base substrate layer to make the first via hole penetrate through the first flexible base substrate layer, and an orthographic projection of a surface of the first buffer layer facing the first flexible base substrate layer on the rigid underlaying substrate is larger than that of a surface of the first flexible base substrate layer facing the first buffer layer on the rigid underlaying substrate | — 2002 |

↓

| Form a second flexible base substrate layer on a side of the first buffer layer away from the first flexible base substrate layer | — 2003 |

↓

| Form a second buffer layer on a side of the second flexible base substrate layer away from the first buffer layer, and form a second via hole having a position corresponding to that of the first via hole on the second buffer layer | — 2004 |

↓

| Process the second flexible base substrate layer to make the first via hole and the second via hole communicated with each other and penetrate through the first flexible base substrate layer and the second flexible base substrate layer, and an orthographic projection of a surface of the second buffer layer facing the second flexible base substrate layer on the rigid underlaying substrate is larger than that of a surface of the second flexible base substrate layer facing the second buffer layer on the rigid underlaying substrate | — 2005 |

↓

| Form a third flexible base substrate layer on a side of the second buffer layer away from the second flexible base substrate layer | — 2006 |

↓

| Form a thin film transistor layer on a side of the third flexible base substrate layer away from the second buffer layer, and form a third via hole having a position corresponding to that of the first via hole and the second via hole on the thin film transistor layer | — 2007 |

↓

| Process the third flexible base substrate layer to make the first via hole, the second via hole, and the third via hole communicated with each other and penetrate through the first flexible base substrate layer, the second flexible base substrate layer, and the third flexible base substrate layer | — 2008 |

↓

| Sequentially form an organic light emitting layer and an encapsulation thin film layer on the thin film transistor layer | — 2009 |

↓

| Lift off the rigid underlaying substrate to obtain a flexible display substrate | — 2010 |

FIG. 20

FLEXIBLE SUBSTRATE, PREPARATION METHOD THEREFOR AND FLEXIBLE DISPLAY SUBSTRATE

CROSS-REFERENCE TO RELATED APPLICATIONS

The present application is a U.S. National Phase Entry of International Application PCT/CN2021/075717 having an international filing date of Feb. 7, 2021, which claims priority of Chinese patent application No. 2020100923873, filed on Feb. 14, 2020, and entitled "Flexible Substrate, Manufacturing Method Thereof, and Flexible Display Substrate", the contents of which should be construed as being hereby incorporated by reference in their entirety.

TECHNICAL FIELD

Embodiments of the present disclosure relate, but are not limited, to the technical field of display, and particularly to a flexible substrate, a method for manufacturing the flexible substrate, and a flexible display substrate.

BACKGROUND

A flexible display device is a display device manufactured based on a flexible base material. In recent years, flexible display device has attracted extensive attraction due to features of flexibility, wide viewing angle, portability, etc. At present, a flexible display device usually adopts an island-bridge structure. The island-bridge structure is formed by arranging light emitting units in pixel island regions and inter-pixel-island connecting wires in connecting bridge regions. When an external tensile force is applied, deformation mainly occurs in the connecting bridge regions, and the light emitting units of the pixel island regions substantially keep their original shape, and may be prevented from being damaged. Meanwhile, a series of microholes may further be formed to improve the deformability of the flexible display device. Therefore, the flexible display device consists of the pixel island regions where the light emitting units are located, the connecting bridge regions where the inter-island connecting wires are located, and a hole region that penetrates through the flexible base substrate.

A flexible display substrate is usually lift off from a rigid underlaying base substrate through a Laser Lift Off (LLO) process after another functional film layer is manufactured on a flexible layer formed on the rigid underlaying base substrate. According to the laser lift off process, an ultraviolet laser is usually used to irradiate the flexible layer from a back surface of the rigid underlaying base substrate to break molecular chains between the flexible layer of an irradiated region and the rigid underlaying base substrate, thereby completing separating the flexible layer from the rigid underlaying base substrate. However, the laser has a relatively strong lift-off force, so that the connecting bridge region is easily broken by a large area during laser lift off, which further results in the cracking of an encapsulation film layer on the flexible display substrate and the breakage of metal wirings in the connecting bridge region and reduces the product yield.

SUMMARY

The following is a summary of the subject matter described in the present disclosure in detail. The summary is not intended to limit the scope of protection of the claims.

An embodiment of the present disclosure provides a method for manufacturing a flexible substrate, which includes that: sequentially forming a first flexible base substrate layer and a first buffer layer on a rigid underlaying substrate, and forming a first via hole on the first buffer layer; processing the first flexible base substrate layer to make the first via hole penetrate through the first flexible base substrate layer, wherein an orthographic projection of a surface of the first buffer layer facing the first flexible base substrate layer on the rigid underlaying substrate is larger than an orthographic projection of a surface of the first flexible base substrate layer facing the first buffer layer on the rigid underlaying substrate; forming a second flexible base substrate layer on a side of the first buffer layer away from the first flexible base substrate layer; processing the second flexible base substrate layer to make the first via hole penetrate through the second flexible base substrate layer; and lifting off the rigid underlaying substrate to obtain the flexible substrate.

In some exemplary embodiments, when the first flexible base substrate layer is processed, the method further enables that a junction surface of the first via hole and the first flexible base substrate layer is a slope surface and an orthographic projection of a surface of the first flexible base substrate layer facing the rigid underlaying substrate on the rigid underlaying substrate is larger than that of a surface of the first flexible base substrate layer away from the rigid underlaying substrate on the rigid underlaying substrate. When the second flexible base substrate layer is processed, the method further enables that a junction surface of the first via hole and the second flexible base substrate layer is a slope surface and an orthographic projection of a surface of the second flexible base substrate layer facing the first buffer layer on the rigid underlaying substrate is larger than that of a surface of the second flexible base substrate layer away from the first buffer layer on the rigid underlaying substrate.

In some exemplary embodiments, before processing the second flexible base substrate layer, the method further includes: forming a second buffer layer on a side of the second flexible base substrate layer away from the first buffer layer, forming a second via hole having a position corresponding to that of the first via hole on the second buffer layer. Processing the second flexible base substrate layer is to make the first via hole penetrate through the second flexible base substrate layer includes: processing the second flexible base substrate layer to make the first via hole and the second via hole communicated with each other and penetrate through the second flexible layer, with an orthographic projection of a surface of the second buffer layer facing the second flexible base substrate layer on the rigid underlaying substrate being larger than that of a surface of the second flexible base substrate layer facing the second buffer layer on the rigid underlaying substrate; forming a third flexible base substrate layer on a side of the second buffer layer away from the second flexible base substrate layer; and processing the third flexible base substrate layer to make the first via hole and the second via hole communicated with each other and penetrate through the third flexible base substrate layer.

In some exemplary embodiments, before processing the second flexible base substrate layer, the method further includes: forming a thin film transistor layer on a side of the second flexible base substrate layer away from the first buffer layer, forming a third via hole having a position corresponding to that of the first via hole on the thin film transistor layer.

Processing the second flexible base substrate layer to make the first via hole penetrate through the second flexible base substrate layer includes: processing the second flexible base substrate layer to make the first via hole and the second via hole communicated with each other and penetrate through the first flexible base substrate layer and the second flexible base substrate layer; and sequentially forming an organic light emitting layer and an encapsulation thin film layer on the thin film transistor layer.

In some exemplary embodiments, when the second flexible base substrate layer is processed, the method further enables that an orthographic projection of a surface of the thin film transistor layer facing the second flexible substrate on the rigid underlaying substrate is larger than that of a surface of the second flexible base substrate layer facing the thin film transistor layer on the rigid underlaying substrate.

An embodiment of the present disclosure further provides a flexible substrate, which includes multiple island regions spaced apart and multiple bridge regions connected between different island regions and has multiple openings in regions which are neither the island regions nor the bridge regions. Multiple layer structures are arranged on each island region. The layer structures include a first flexible base substrate layer, a first buffer layer, and a second flexible base substrate layer which are sequentially arranged from bottom to top. An orthographic projection of a surface of the first buffer layer facing the first flexible base substrate layer on the first flexible base substrate layer is larger than that of a surface of the first flexible base substrate layer facing the first buffer layer on the first flexible base substrate layer.

In some exemplary embodiments, a junction surface of an opening and the first flexible base substrate layer is a slope surface. An orthographic projection of a surface of the first flexible base substrate layer away from the first buffer layer on the first flexible base substrate layer is larger than that of the surface of the first flexible base substrate layer facing the first buffer layer on the first flexible base substrate layer.

In some exemplary embodiments, a junction surface of an opening and the second flexible base substrate layer is a slope surface. An orthographic projection of a surface of the second flexible base substrate layer facing the first buffer layer on the first flexible base substrate layer is larger than that of a surface of the second flexible base substrate layer away from the first buffer layer on the first flexible base substrate layer.

In some exemplary embodiments, inter-penetrating via holes are formed on the first flexible base substrate layer, the first buffer layer, the second flexible base substrate layer, a second buffer layer, and a third flexible base substrate layer. Positions of the via holes correspond to those of the openings.

In some exemplary embodiments, the layer structures further comprise a second buffer layer and a third flexible base substrate layer. The second buffer layer is arranged on a side of the second flexible base substrate layer away from the first buffer layer. The third flexible base substrate layer is arranged on a side of the second buffer layer away from the second flexible base substrate layer. An orthographic projection of a surface of the second buffer layer facing the second flexible base substrate layer on the first flexible base substrate layer is larger than that of a surface of the second flexible base substrate layer facing the second buffer layer on the first flexible base substrate layer.

In some exemplary embodiments, inter-penetrating via holes are formed on the first flexible base substrate layer, the first buffer layer, the second flexible base substrate layer, the second buffer layer, and the third flexible base substrate layer. Positions of the via holes correspond to those of the openings.

An embodiment of the present disclosure further provides a flexible display substrate, including a flexible substrate, a thin film transistor layer, an organic light emitting layer, and an encapsulation thin film layer which are sequentially arranged from bottom to top. The flexible substrate includes multiple island regions spaced apart and multiple bridge regions connected between different island regions, and has multiple openings in regions which are neither the island regions nor the bridge region. Multiple layer structures are arranged on each island region. The layer structures include a first flexible base substrate layer, a first buffer layer, and a second flexible base substrate layer which are sequentially stacked from bottom to top. An orthographic projection of a surface of the first buffer layer facing the first flexible base substrate layer on the first flexible base substrate layer is larger than that of a surface of the first flexible base substrate layer facing the first buffer layer on the first flexible base substrate layer.

In some exemplary embodiments, the encapsulation thin film layer covers a surface of the organic light emitting layer away from the first flexible base substrate layer and sidewalls of the first flexible base substrate layer, the first buffer layer, the second flexible base substrate layer, and the thin film transistor layer at the side close to the opening.

Other aspects can be understood upon reading and understanding of the description of the drawings and implementation modes of the present disclosure.

BRIEF DESCRIPTION OF DRAWINGS

The drawings are used to provide an understanding of technical solutions of the present disclosure, form a part of the specification, and are used to explain, together with the embodiments of the present disclosure, the technical solutions of the present disclosure and are not intended to form limitations on the technical solutions of the present disclosure.

FIG. 1 is a flowchart of a method for manufacturing a flexible substrate according to an embodiment of the present disclosure.

FIG. 2 is a schematic structural diagram of a flexible substrate after a first flexible base substrate layer is formed in the method shown in FIG. 1.

FIG. 8 is a flowchart of another method for manufacturing a flexible substrate according to an embodiment of the present disclosure.

FIG. 14 is a flowchart of a method for manufacturing a flexible display substrate according to an embodiment of the present disclosure.

FIG. 15 is a schematic structural diagram of a flexible display substrate after a thin film transistor layer is formed in the method shown in FIG. 14.

FIG. 20 is a flowchart of another method for manufacturing a flexible display substrate according to an embodiment of the present disclosure.

DETAILED DESCRIPTION

Figure 3:
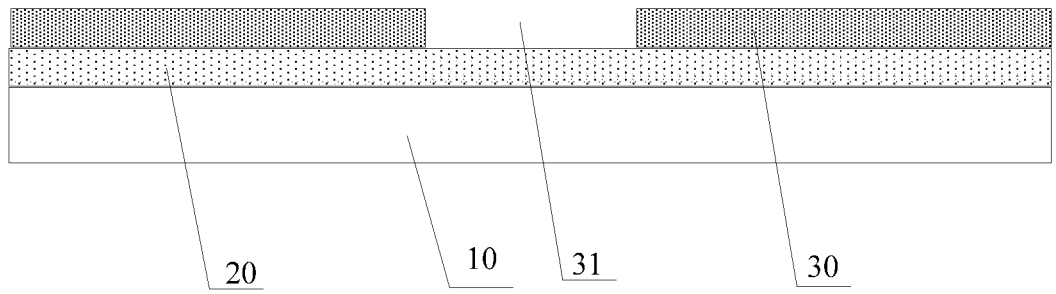
FIG. 3 is a schematic structural diagram of a flexible substrate after a first buffer layer is formed in the method shown in FIG. 1.

In order to make the purposes, technical solutions, and advantages of the present disclosure clearer, the embodiments of the present disclosure will be described below in combination with the drawings in detail. It is to be noted that the embodiments in the present disclosure and features in the embodiments may be combined with each other randomly if there is no conflict.

Unless otherwise defined, technical terms or scientific terms used in the embodiments of the present disclosure should have the same meanings as commonly understood by those of ordinary skills in the art to which the present disclosure pertains. "First", "second", and similar wordings used in the embodiments of the present disclosure do not represent any sequence, number, or significance but are only used to distinguish different components. "Include", "contain", or a similar term means that an element or object appearing before the term covers an element or object and equivalent thereof listed after the term and does not exclude other elements or objects.

When laser lift off is performed on an existing flexible display substrate, a connecting bridge region is easily broken by a large area, which further results in the cracking of an encapsulation film layer on the flexible display substrate and the breakage of metal wirings in a connecting bridge region and reduces the product yield. When laser lift off is performed on a flexible display substrate provided in an embodiment of the present disclosure, a sidewall encapsulation structure of a first flexible base substrate layer is sacrificed, and a sidewall encapsulation structure of a film layer above the first flexible base substrate layer is protected, so that the cracking of metal wirings in the connecting bridge region caused by the laser lift off is reduced, and the product yield is increased.

FIG. 1 is a schematic diagram of a method for manufacturing a flexible substrate according to an embodiment of the present disclosure. As shown in FIG. 1, the method for manufacturing a flexible substrate in an embodiment of the present disclosure includes the following. In Step 101, a first flexible base substrate layer and a first buffer layer are sequentially formed on a rigid underlaying substrate, and a first via hole is formed on the first buffer layer. In Step 102, the first flexible base substrate layer is processed to make the first via hole penetrate through the first flexible base substrate layer, and an orthographic projection of a surface of the first buffer layer facing the first flexible base substrate layer on the rigid underlaying substrate is larger than that of a surface of the first flexible base substrate layer facing the first buffer layer on the rigid underlaying substrate. In Step 103, a second flexible base substrate layer is formed on a side of the first buffer layer away from the first flexible base substrate layer. In Step 104, the second flexible base substrate layer is processed to make the first via hole penetrate through the second flexible base substrate layer. In Step 105, the rigid underlaying substrate is lifted off to obtain the flexible substrate.

The technical solution of the present embodiment will be described below through a manufacturing process of the flexible substrate. The manufacturing process of the flexible substrate in the present embodiment includes:

(1) As shown in FIG. 2, a first flexible base substrate layer 20 is formed on a rigid underlaying substrate 10.

In this step, the rigid underlaying substrate 10 may be a substrate made of a material with certain strength such as glass, quartz, or transparent resin. The first flexible base substrate layer 20 may be a Polyimide (PI) layer.

In some embodiments, forming the first flexible base substrate layer 20 on the rigid underlaying substrate 10 may include that: the rigid underlaying substrate 10 is coated with a layer of PI solution, and the PI solution is dried to remove a solvent of the PI solution with a solute of the PI solution retained to form the first flexible base substrate layer 20. The drying may be, for example, a low-pressure drying process, a high-pressure drying process, or an air-cooling drying process. No limits are made thereto in the embodiment of the present disclosure.

(2) As shown in FIG. 3, a first buffer layer 30 is formed on a side of the first flexible base substrate layer 20 away from the rigid underlaying substrate 10, and a first via hole 31 is formed on the first buffer layer 30.

In this step, a material of the first buffer layer 30 may be an inorganic material such as silicon oxide (SiOx), silicon nitride (SiNx), alumina (Al2O3), or silicon oxynitride (SiOxNx).

In some embodiments, the first buffer layer 30 is formed on the side of the first flexible base substrate layer 20 away from the rigid underlaying substrate 10 by coating, magnetron sputtering, thermal evaporation, Plasma Enhanced Chemical Vapor Deposition (PECVD), or other methods.

In some embodiments, the first via hole 31 on the first buffer layer 30 is formed by a patterning process. The patterning process may include photoresist coating, exposure, development, etching, photoresist lift off, etc.

Figure 4:
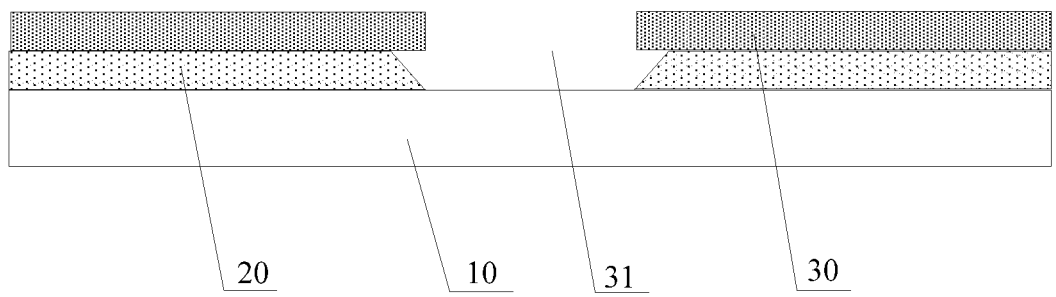
FIG. 4 is a schematic structural diagram of a flexible substrate after a first flexible base substrate layer is processed in the method shown in FIG. 1.

(3) As shown in FIG. 4, the first flexible base substrate layer 20 is processed to make the first via hole 31 penetrate through the first flexible base substrate layer 20 and an orthographic projection of a surface of the first buffer layer 30 facing the first flexible base substrate layer 20 on the rigid underlaying substrate 10 is larger than that of a surface of the first flexible base substrate layer 20 facing the first buffer layer 30 on the rigid underlaying substrate 10.

In some embodiments, the first flexible base substrate layer 20 is processed by etching and other methods to make the first via hole 31 penetrate through the first flexible base substrate layer 20.

In some embodiments, a junction surface of the first via hole 31 and the first flexible base substrate layer 20 is a slope surface. An orthographic projection of a surface of the first flexible base substrate layer 20 facing the rigid underlaying substrate 10 on the rigid underlaying substrate 10 is larger than that of a surface of the first flexible base substrate layer 20 away from the rigid underlaying substrate 10 on the rigid underlaying substrate 10.

Figure 5:
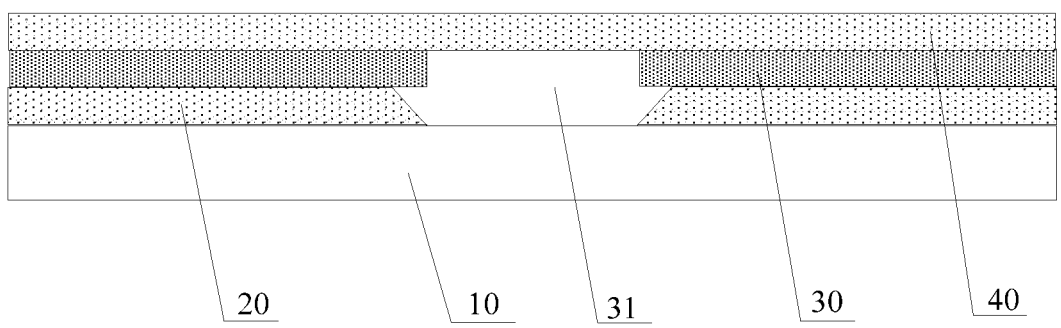
FIG. 5 is a schematic structural diagram of a flexible substrate after a second flexible base substrate layer is formed in the method shown in FIG. 1.

(4) As shown in FIG. 5, a second flexible base substrate layer 40 is formed on a side of the first buffer layer 30 away from the first flexible base substrate layer 20.

In some embodiments, forming the second flexible base substrate layer 40 on the side of the first buffer layer 30 away from the first flexible base substrate layer 20 may include that: the side of the first buffer layer 30 away from the first flexible base substrate layer 20 is coated with a layer of PI solution, and the PI solution is dried to remove a solvent of the PI solution with a solute of the PI solution retained to form the second flexible base substrate layer 40.

Figure 6:
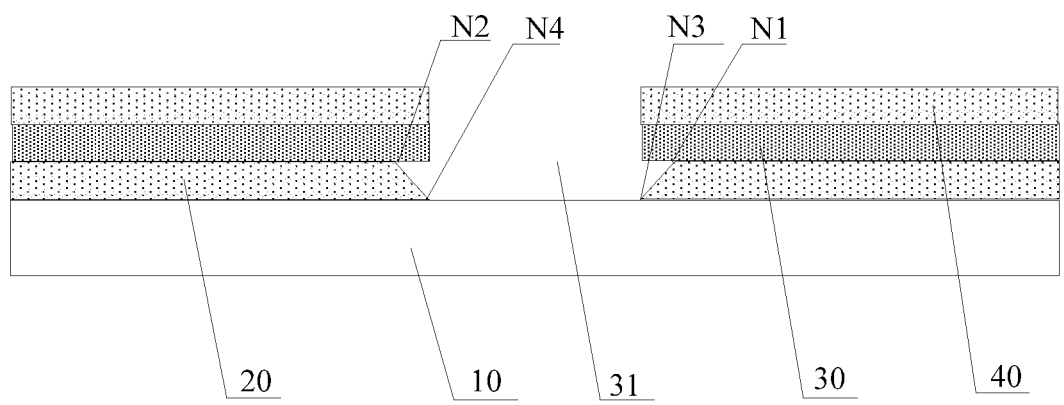
FIG. 6 is a schematic structural diagram of a flexible substrate after a second flexible base substrate layer is processed in the method shown in FIG. 1.

(5) As shown in FIG. 6, the second flexible base substrate layer 40 is processed to make the first via hole 31 penetrate through the second flexible base substrate layer 40.

In some embodiments, a junction surface of the first via hole 31 and the second flexible base substrate layer 40 is a slope surface. An orthographic projection of a surface of the second flexible base substrate layer 40 facing the first buffer layer 30 on the rigid underlaying substrate 10 is larger than that of a surface of the second flexible base substrate layer 40 away from the first buffer layer 30 on the rigid underlaying substrate 10.

In some embodiments, the second flexible base substrate layer 40 is processed by etching and other methods to make the first via hole 31 penetrate through the second flexible base substrate layer 40.

(6) The rigid underlaying substrate 10 is lifted off to obtain the flexible substrate.

In some embodiments, the rigid underlaying substrate 10 is lifted off through a laser lift off process.

Figure 7:
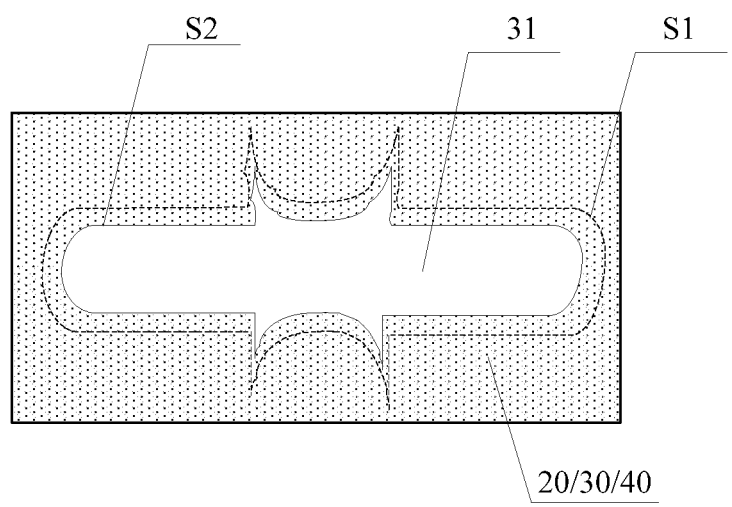
FIG. 7 is a top structural view of the flexible substrate shown in FIG. 6.

In the present embodiment, as shown in FIGS. 6 and 7, the orthographic projection S1 of the surface of the first buffer layer 30 facing the first flexible base substrate layer 20 on the rigid underlaying substrate 10 is larger than the orthographic projection S2 of the surface of the first flexible base substrate layer 20 facing the first buffer layer 30 on the rigid underlaying substrate 10, so that weak points N1 and N2 are formed at junctions of the first buffer layer 30, the first flexible base substrate layer 20, and the first via hole 31, and weak points N3 and N4 are formed at junctions of the first flexible base substrate layer 20, the first via hole 31, and the rigid underlaying substrate 10. Furthermore, cracking of the encapsulation film layer occurs to a sidewall of the first flexible base substrate layer 20 as much as possible during the laser lift off, and is unlikely to occur to a film layer above the first flexible base substrate layer 20, thus breakage of metal wirings in a connecting bridge region is further reduced, and the product yield is improved.

Referring to FIG. 8, an embodiment of the present disclosure further provides a flowchart of a method for manufacturing a flexible substrate. As shown in FIG. 8, the manufacturing method includes the following steps. In Step 801, a first flexible base substrate layer and a first buffer layer are sequentially formed on a rigid underlaying substrate, and a first via hole is formed on the first buffer layer. In Step 802, the first flexible base substrate layer is processed to make the first via hole penetrate through the first flexible base substrate layer and an orthographic projection of a surface of the first buffer layer facing the first flexible base substrate layer on the rigid underlaying substrate is larger than that of a surface of the first flexible base substrate layer facing the first buffer layer on the rigid underlaying substrate. In Step 803, a second flexible base substrate layer is formed on a side of the first buffer layer away from the first flexible base substrate layer. In Step 804, a second buffer layer is formed on a side of the second flexible base substrate layer away from the first buffer layer, a second via hole having a position corresponding to that of the first via hole is formed on the second buffer layer. In Step 805, the second flexible base substrate layer is processed to make the first via hole and the second via hole communicated with each other and penetrate through the second flexible base substrate layer and an orthographic projection of a surface of the second buffer layer facing the second flexible base substrate layer on the rigid underlaying substrate is larger than that of a surface of the second flexible base substrate layer facing the second buffer layer on the rigid underlaying substrate. In Step 806, a third flexible base substrate layer is formed on a side of the second buffer layer away from the second flexible base substrate layer. In Step 807, the third flexible base substrate layer is processed to make the first via hole and the second via hole communicated with each other and penetrate through the third flexible base substrate layer. In Step 808, the rigid underlaying substrate is lifted off to obtain the flexible substrate.

The technical solution of the present embodiment will be described below through a manufacturing process of the flexible substrate. The manufacturing process of the flexible substrate in the present embodiment includes:

(I) As shown in FIG. 2, a first flexible base substrate layer 20 is formed on a rigid underlaying substrate 10.

(II) As shown in FIG. 3, a first buffer layer 30 is formed on a side of the first flexible base substrate layer 20 away from the rigid underlaying substrate 10, and a first via hole 31 is formed on the first buffer layer 30.

(III) As shown in FIG. 4, the first flexible base substrate layer 20 is processed to make the first via hole 31 penetrate through the first flexible base substrate layer 20 and an orthographic projection of a surface of the first buffer layer 30 facing the first flexible base substrate layer 20 on the rigid underlaying substrate 10 is larger than that of a surface of the first flexible base substrate layer 20 facing the first buffer layer 30 on the rigid underlaying substrate 10.

(IV) As shown in FIG. 5, a second flexible base substrate layer 40 is formed on a side of the first buffer layer 30 away from the first flexible base substrate layer 20.

(I) to (IV) in the abovementioned manufacturing process may refer to (1) to (4) in the manufacturing process of the embodiment shown in FIG. 1, which will not be described repeatedly in the embodiment of the present disclosure.

Figure 9:
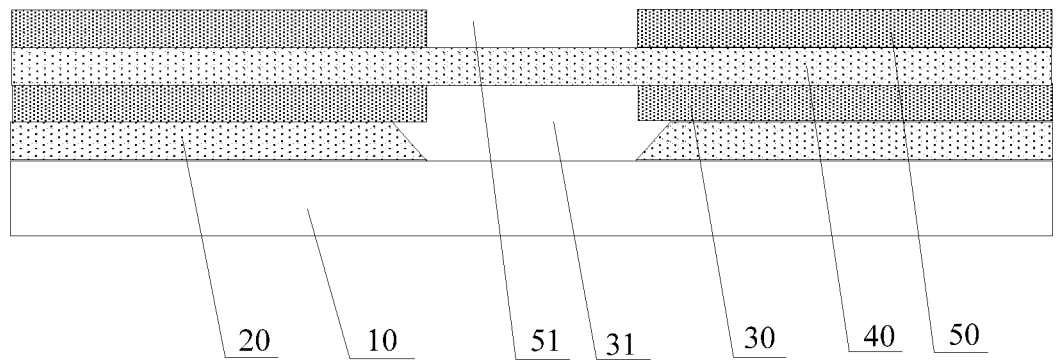
FIG. 9 is a schematic structural diagram of a flexible substrate after a second buffer layer is formed in the method shown in FIG. 8.

(V) As shown in FIG. 9, a second buffer layer 50 is formed on a side of the second flexible base substrate layer 40 away from the first buffer layer 30, a second via hole 51 is formed on the second buffer layer 50, wherein a position of the first via hole 31 is corresponding to that of the second via hole 51.

In this step, a material of the second buffer layer 50 may be an inorganic material such as silicon oxide, silicon nitride, aluminium oxide, or silicon oxynitride.

In some embodiments, the second buffer layer 50 is formed on the side of the second flexible base substrate layer 40 away from the first buffer layer 30 by coating, magnetron sputtering, thermal evaporation, plasma enhanced chemical vapor deposition, or other methods.

In some embodiments, the second via hole 51 on the second buffer layer 50 is formed by a patterning process. The patterning process may include photoresist coating, exposure, development, etching, photoresist lift off, etc.

Figure 10:
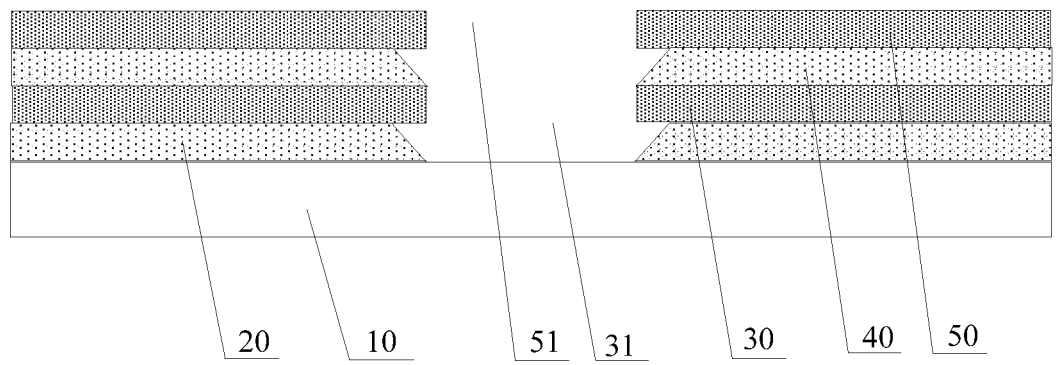
FIG. 10 is a schematic structural diagram of a flexible substrate after a second flexible base substrate layer is processed in the method shown in FIG. 8.

(VI) As shown in FIG. 10, the second flexible base substrate layer 40 is processed to make the first via hole 31 and the second via hole 51 communicated with each other and penetrate through the second flexible base substrate layer 40 and an orthographic projection of a surface of the second buffer layer 50 facing the second flexible base substrate layer 40 on the rigid underlaying substrate 10 is larger than that of a surface of the second flexible base substrate layer 40 facing the second buffer layer 50 on the rigid underlaying substrate 10.

In some embodiments, the second flexible base substrate layer 40 is processed by etching and other methods to make the first via hole 31 and the second via hole 51 communicated with each other and penetrate through the second flexible base substrate layer 40.

In some embodiments, a junction surface of the second via hole 51 and the second flexible base substrate layer 40 is a slope surface. An orthographic projection of a surface of the second flexible base substrate layer 40 facing the rigid underlaying substrate 10 on the rigid underlaying substrate 10 is larger than that of a surface of the second flexible base substrate layer 40 away from the rigid underlaying substrate 10 on the rigid underlaying substrate 10.

Figure 11:
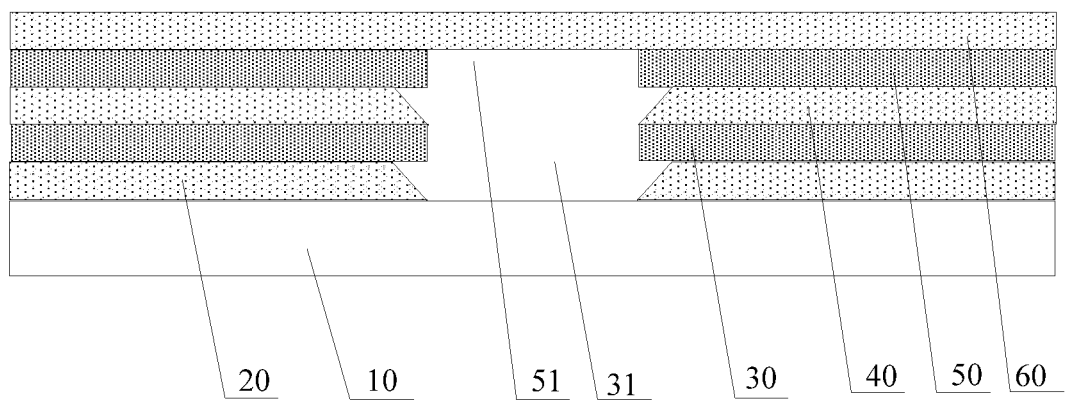
FIG. 11 is a schematic structural diagram of a flexible substrate after a third flexible base substrate layer is formed in the method shown in FIG. 8.

(VII) As shown in FIG. 11, a third flexible base substrate layer 60 is formed on a side of the second buffer layer 50 away from the second flexible base substrate layer 40.

In some embodiments, forming the third flexible base substrate layer 60 on a side of the second buffer layer 50 away from the second flexible base substrate layer 40 may include that: the side of the second buffer layer 50 away from the second flexible base substrate layer 40 is coated with a layer of PI solution, and the PI solution is dried to remove a solvent of the PI solution with a solute of the PI solution retained to form the third flexible base substrate layer 60.

Figure 12:
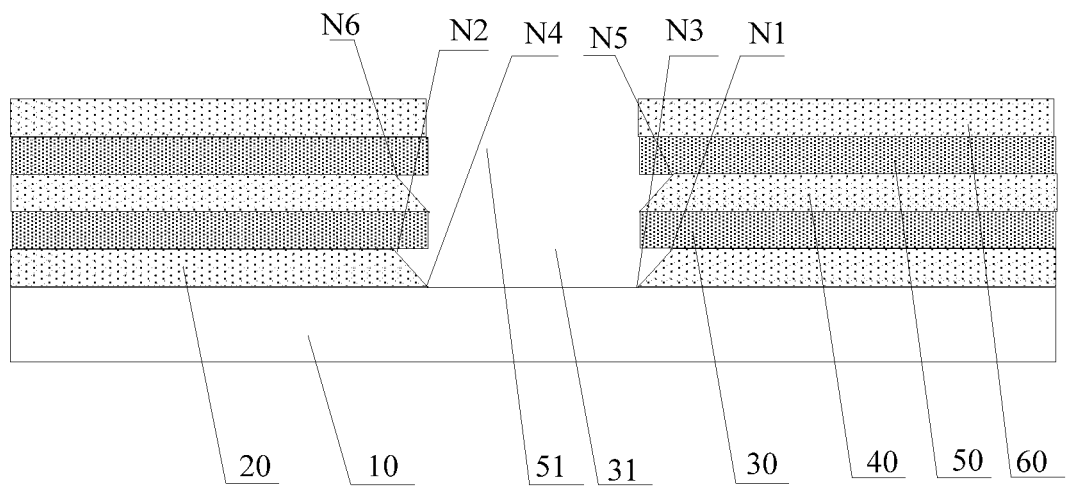
FIG. 12 is a schematic structural diagram of a flexible substrate after a third flexible base substrate layer is processed in the method shown in FIG. 8.

(VIII) As shown in FIG. 12, the third flexible base substrate layer 60 is processed to make the first via hole 31 and the second via hole 51 communicated with each other and penetrate through the first flexible base substrate layer 20, the second flexible base substrate layer 40, and the third flexible base substrate layer 60.

In some embodiments, the third flexible base substrate layer 60 is processed by etching and other methods to make the first via hole 31 and the second via hole 51 communicated with each other and penetrate through the first flexible base substrate layer 20, the second flexible base substrate layer 40, and the third flexible base substrate layer 60.

(IX) The rigid underlaying substrate 10 is lifted off to obtain the flexible substrate. In some embodiments, the rigid underlaying substrate 10 is lifted off through a laser lift off process.

Figure 13:
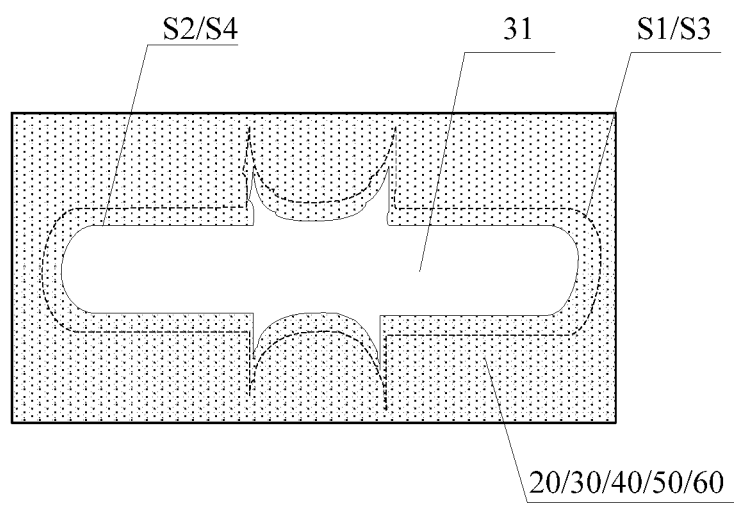
FIG. 13 is a top structural view of the flexible substrate shown in FIG. 12.

In the present embodiment, as shown in FIGS. 12 and 13, the orthographic projection S3 of the surface of the second buffer layer 50 facing the second flexible base substrate layer 40 on the rigid underlaying substrate 10 is larger than the orthographic projection S4 of the surface of the second flexible base substrate layer 40 facing the second buffer layer 50 on the rigid underlaying substrate 10, and the orthographic projection S1 of the surface of the first buffer layer 30 facing the first flexible base substrate layer 20 on the rigid underlaying substrate 10 is larger than the orthographic projection S2 of the surface of the first flexible base substrate layer 20 facing the first buffer layer 30 on the rigid underlaying substrate 10, so that weak points N5 and N6 are formed at junctions of the second buffer layer 50, the second flexible base substrate layer 40, and the second via hole 51, weak points N1 and N2 are formed at junctions of the first buffer layer 30, the first flexible base substrate layer 20, and the first via hole 31, and weak points N3 and N4 are formed at junctions of the first flexible base substrate layer 20, the first via hole 31, and the rigid underlaying substrate 10. Furthermore, cracking of an encapsulation film layer occurs to a sidewall of the first flexible base substrate layer 20 or the second flexible base substrate layer 40 as much as possible during the laser lift off, and is unlikely to occur to a film layer above the second flexible base substrate layer 40, the breakage of metal wirings in a connecting bridge region is further reduced, and the product yield is improved.

FIG. 14 is a schematic diagram of a method for manufacturing a flexible display substrate according to an embodiment of the present disclosure. As shown in FIG. 14, the method for manufacturing the flexible display substrate according to the embodiment of the present disclosure includes the following. In Step 1401, a first flexible base substrate layer and a first buffer layer are sequentially formed on a rigid underlaying substrate, and a first via hole is formed on the first buffer layer. In Step 1402, the first flexible base substrate layer is processed to make the first via hole penetrate through the first flexible base substrate layer and an orthographic projection of a surface of the first buffer layer facing the first flexible base substrate layer on the rigid underlaying substrate is larger than that of a surface of the first flexible base substrate layer facing the first buffer layer on the rigid underlaying substrate. In Step 1403, a second flexible base substrate layer is formed on a side of the first buffer layer away from the first flexible base substrate layer. In Step 1404, a thin film transistor layer is formed on a side of the second flexible base substrate layer away from the first buffer layer, a third via hole having a position corresponding to that of the first via hole is formed on the thin film transistor layer. In Step 1405, the second flexible base substrate layer is processed to make the first via hole and the third via hole communicated with each other and penetrate through the first flexible base substrate layer and the second flexible base substrate layer. In Step 1406, an organic light emitting layer and an encapsulation thin film layer are sequentially formed on the thin film transistor layer. In Step 1407, the rigid underlaying substrate is lifted off to obtain the flexible display substrate.

The technical solution of the present embodiment will be described below through a manufacturing process of the flexible display substrate. The manufacturing process of the flexible display substrate in the present embodiment includes:

(A) As shown in FIG. 2, a first flexible base substrate layer 20 is formed on a rigid underlaying substrate 10.

(B) As shown in FIG. 3, a first buffer layer 30 is formed on a side of the first flexible base substrate layer 20 away from the rigid underlaying substrate 10, and a first via hole 31 is formed on the first buffer layer 30.

(C) As shown in FIG. 4, the first flexible base substrate layer 20 is processed to make the first via hole 31 penetrate through the first flexible base substrate layer 20 and an orthographic projection of a surface of the first buffer layer 30 facing the first flexible base substrate layer 20 on the rigid underlaying substrate 10 is larger than that of a surface of the first flexible base substrate layer 20 facing the first buffer layer 30 on the rigid underlaying substrate 10.

(D) As shown in FIG. 5, a second flexible base substrate layer 40 is formed on a side of the first buffer layer 30 away from the first flexible base substrate layer 20.

(A) to (D) in the abovementioned manufacturing process may refer to (1) to (4) in the manufacturing process of the embodiment shown in FIG. 1, which will not be described repeatedly in the embodiment of the present disclosure.

(E) As shown in FIG. 15, a thin film transistor layer 70 is formed on a side of the second flexible base substrate layer 40 away from the first buffer layer 30, a third via hole 71 is formed on the thin film transistor layer 70, wherein a position of the third via hole 71 is corresponding to a position of the first via hole 31.

In some embodiments, the thin film transistor layer 70 includes an active layer, a gate insulating layer, a gate, an interlayer insulating layer, a source, and a drain. Via holes corresponding to the source and the drain are formed on the interlayer insulating layer and the gate insulating layer. The source and the drain contact with the active layer through the via holes formed on the interlayer insulating layer and the gate insulating layer respectively.

In some embodiments, the third via hole 71 on the thin film transistor layer 70 is formed by a patterning process. The patterning process may include photoresist coating, exposure, development, etching, photoresist lift off, etc.

Figure 16:
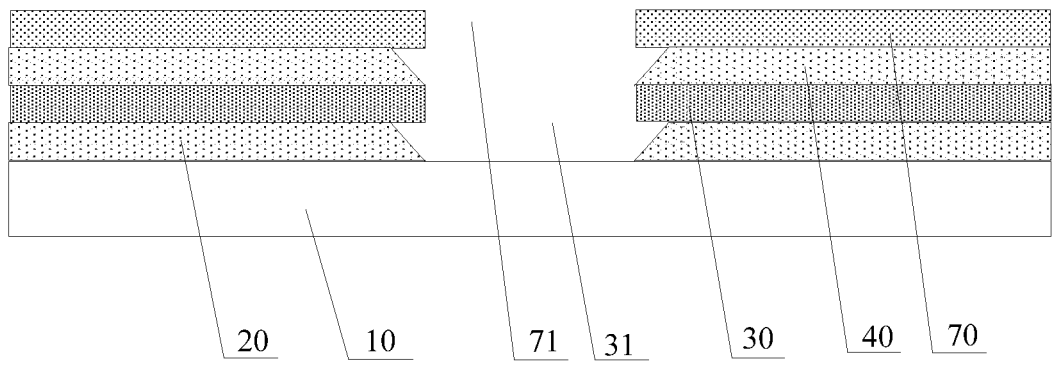
FIG. 16 is a schematic structural diagram of a flexible display substrate after a second flexible base substrate layer is processed in the method shown in FIG. 14.

(F) As shown in FIG. 16, the second flexible base substrate layer 40 is processed to make the first via hole 31 and the third via hole 71 communicated with each other and penetrate through the first flexible base substrate layer 20 and the second flexible base substrate layer 40.

In some embodiments, when the second flexible base substrate layer 40 is processed, an orthographic projection of a surface of the thin film transistor layer 70 facing the second flexible base substrate layer 40 on the rigid underlaying substrate 10 is larger than that of a surface of the second flexible base substrate layer 40 facing the thin film transistor layer 70 on the rigid underlaying substrate 10.

Figure 17:
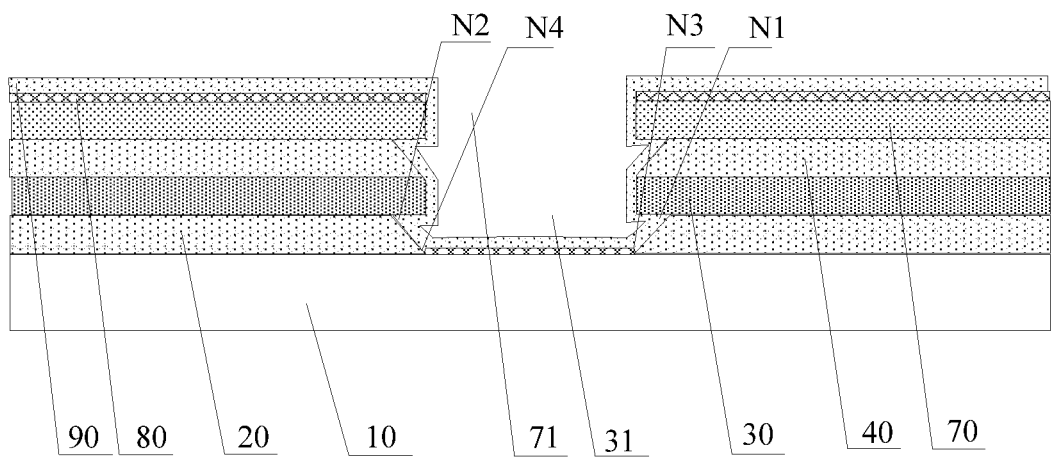
FIG. 17 is a schematic structural diagram of a flexible display substrate after an organic light emitting layer and an encapsulation thin film layer are formed in the method shown in FIG. 14.
Figure 18:
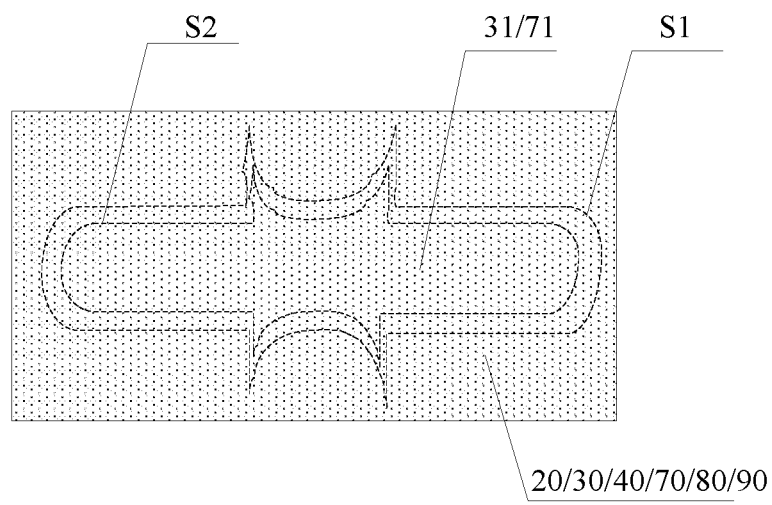
FIG. 18 is a top structural view of the flexible substrate shown in FIG. 17.

(G) As shown in FIGS. 17 and 18, an organic light emitting layer 80 and an encapsulation thin film layer 90 are sequentially formed on the thin film transistor layer 70.

In some embodiments, the organic light emitting layer 80 is formed on the thin film transistor layer 70 through an evaporation process.

In some embodiments, the encapsulation thin film layer 90 may be made by Chemical Vapor Deposition (CVD), sputtering, or other coating manners. The encapsulation thin film layer 90 serves to isolate water and oxygen, and may effectively prevent the contact between air and the organic light emitting layer 80.

(H) The rigid underlaying substrate is lifted off to obtain the flexible display substrate.

Figure 19:
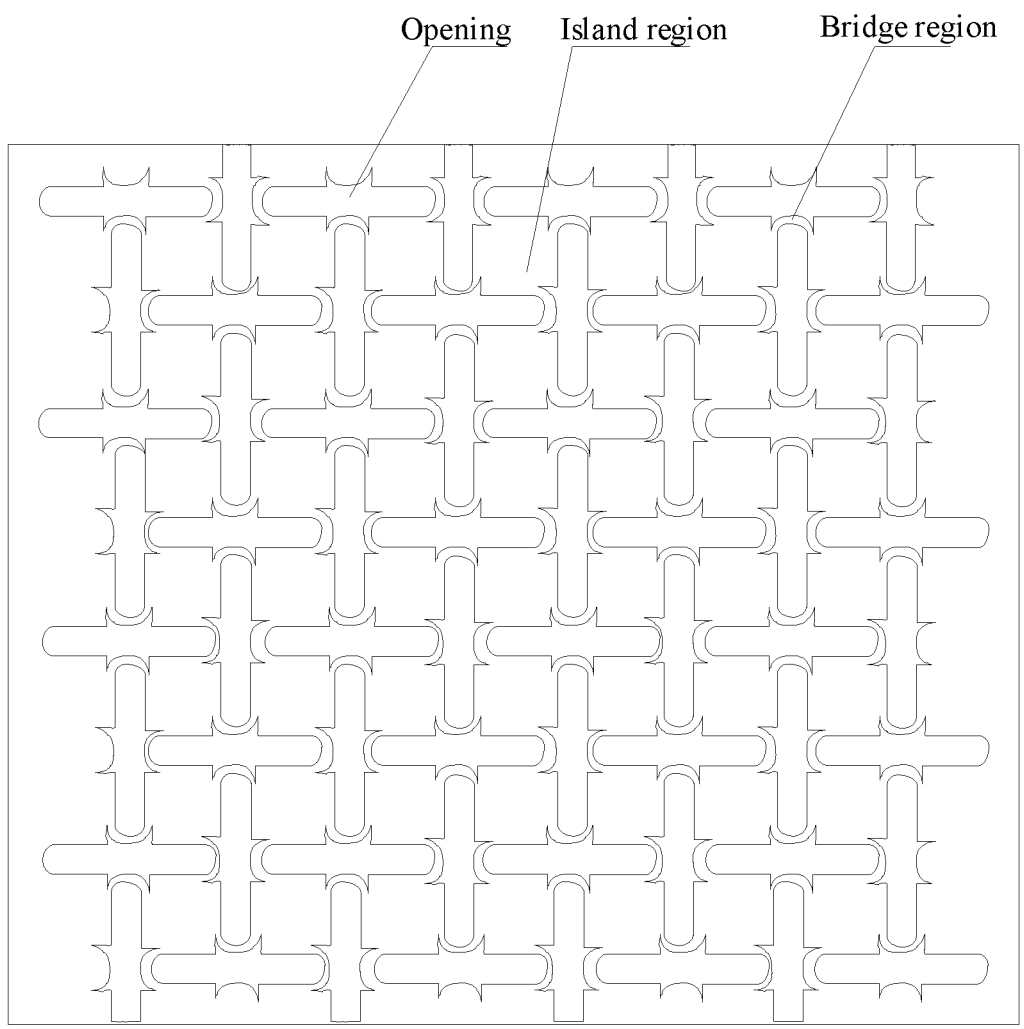
FIG. 19 is a top view of a flexible display substrate manufactured by a manufacturing method according to an embodiment of the present application.

FIG. 19 is a top view of a flexible display substrate manufactured by the manufacturing method according to the present embodiment. As shown in FIG. 19, the flexible display substrate includes multiple island regions spaced apart and multiple bridge regions connected between different island regions, and has multiple openings in regions which are neither island regions nor bridge regions. Multiple layer structures are arranged on each island region. The layer structures in each island region form at least one display unit. Signal lines connecting multiple display units are arranged in each bridge region.

In some embodiments, the method further includes that: an upper surface and a lower surface of the flexible substrate are coated with Temporary Process Films (TPFs), wherein the TPF is configured to protect the organic light emitting layer 80 and the encapsulation thin film layer 90.

In the present embodiment, as shown in FIGS. 17 and 18, the orthographic projection S1 of the surface of the first buffer layer 30 facing the first flexible base substrate layer 20 on the rigid underlaying substrate 10 is larger than the orthographic projection S2 of the surface of the first flexible base substrate layer 20 facing the first buffer layer 30 on the rigid underlaying substrate 10, so that weak points N1 and N2 are formed at junctions of the first buffer layer 30, the first flexible base substrate layer 20, and the first via hole 31, and weak points N3 and N4 are formed at junctions of the first flexible base substrate layer 20, the first via hole 31, and the rigid underlaying substrate 10. Furthermore, cracking of the encapsulation film layer occurs to a sidewall of the first flexible base substrate layer 20 as much as possible during the laser lift off, and is unlikely to occur to a film layer above the first flexible base substrate layer 20, thus the breakage of metal wirings in a connecting bridge region is further reduced, and the product yield is improved.

FIG. 20 is a schematic diagram of another method for manufacturing a flexible display substrate according to an embodiment of the present disclosure. As shown in FIG. 20, the method for manufacturing the flexible display substrate according to the embodiment of the present disclosure includes the following. In Step 2001, a first flexible base substrate layer and a first buffer layer are sequentially formed on a rigid underlaying substrate, and a first via hole is formed on the first buffer layer. In Step 2002, the first flexible base substrate layer is processed to make the first via hole penetrate through the first flexible base substrate layer and an orthographic projection of a surface of the first buffer layer facing the first flexible base substrate layer on the rigid underlaying substrate is larger than that of a surface of the first flexible base substrate layer facing the first buffer layer on the rigid underlaying substrate. In Step 2003, a second flexible base substrate layer is formed on a side of the first buffer layer away from the first flexible base substrate layer. In Step 2004, a second buffer layer is formed on a side of the second flexible base substrate layer away from the first buffer layer, a second via hole having a position corresponding to that of the first via hole is formed on the second buffer layer. In Step 2005, the second flexible base substrate layer is processed to make the first via hole and the second via hole communicated with each other and penetrate through the first flexible base substrate layer and the second flexible base substrate layer and an orthographic projection of a surface of the second buffer layer facing the second flexible base substrate layer on the rigid underlaying substrate is larger than that of a surface of the second flexible base substrate layer facing the second buffer layer on the rigid underlaying substrate. In Step 2006, a third flexible base substrate layer is formed on a side of the second buffer layer away from the second flexible base substrate layer. In Step 2007, a thin film transistor layer is formed on a side of the third flexible base substrate layer away from the second buffer layer, a third via hole having a position corresponding to those of the first via hole and the second via hole is formed on the thin film transistor layer. In Step 2008, the third flexible base substrate layer is processed to make the first via hole, the second via hole, and the third via hole communicated with each other and penetrate through the first flexible base substrate layer, the second flexible base substrate layer, and the third flexible base substrate layer. In Step 2009, an organic light emitting layer and an encapsulation thin film layer are sequentially formed on the thin film transistor layer. In Step 2010, the rigid underlaying substrate is lifted off to obtain the flexible display substrate.

Step 2001 to Step 2010 in the present implementation mode are similar to those in the abovementioned implementation modes, which will not be described repeatedly here to avoid repetition.

Figure 21:
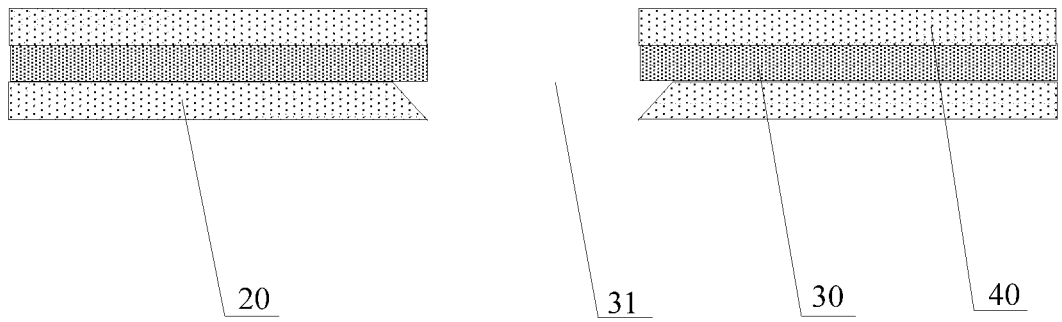
FIG. 21 is a schematic structural diagram of a flexible substrate according to an embodiment of the present disclosure.

As shown in FIGS. 21 and 7, an embodiment of the present disclosure further provides a flexible substrate, which includes multiple island regions spaced apart and multiple bridge regions connected between different island regions and has multiple openings in regions which are neither island regions nor bridge regions. Multiple layer structures are arranged on each island region. The layer structures include a first flexible base substrate layer 20, a first buffer layer 30, and a second flexible base substrate layer 40 which are sequentially arranged from the bottom to the top. An orthographic projection of a surface of the first buffer layer 30 facing the first flexible base substrate layer 20 on the first flexible base substrate layer 20 is larger than that of a surface of the first flexible base substrate layer 20 facing the first buffer layer 30 on the first flexible base substrate layer 20.

In an exemplary embodiment, a junction surface of the opening (i.e., the first via hole 31 in FIG. 18) and the first flexible base substrate layer 20 is a slope surface. An orthographic projection of a surface of the first flexible base substrate layer 20 away from the first buffer layer 30 on the first flexible base substrate layer 20 is larger than that of the surface of the first flexible base substrate layer 20 facing the first buffer layer 30 on the first flexible base substrate layer 20.

In an exemplary embodiment, a junction surface of the opening and the second flexible base substrate layer 40 is a slope surface. An orthographic projection of a surface of the second flexible base substrate layer 40 facing the first buffer layer 30 on the first flexible base substrate layer 20 is larger than that of a surface of the second flexible base substrate layer 40 away from the first buffer layer 30 on the first flexible base substrate layer 20.

In an exemplary embodiment, inter-penetrating via holes are formed on the first flexible base substrate layer, the first buffer layer, and the second flexible base substrate layer. Positions of the via holes correspond to those of the openings.

In an exemplary embodiment, the layer structures further include a second buffer layer and a third flexible base substrate layer.

The second buffer layer is arranged on a side of the second flexible base substrate layer 40 away from the first buffer layer 30.

The third flexible base substrate layer is arranged on a side of the second buffer layer away from the second flexible base substrate layer 40. An orthographic projection of a surface of the second buffer layer facing the second flexible base substrate layer 40 on the first flexible base substrate layer 20 is larger than that of a surface of the second flexible base substrate layer 40 facing the second buffer layer on the first flexible base substrate layer 20.

In an exemplary embodiment, inter-penetrating via holes are formed on the first flexible base substrate layer, the first buffer layer, the second flexible base substrate layer, the second buffer layer, and the third flexible base substrate layer. Positions of the via holes correspond to those of the openings.

Figure 22:
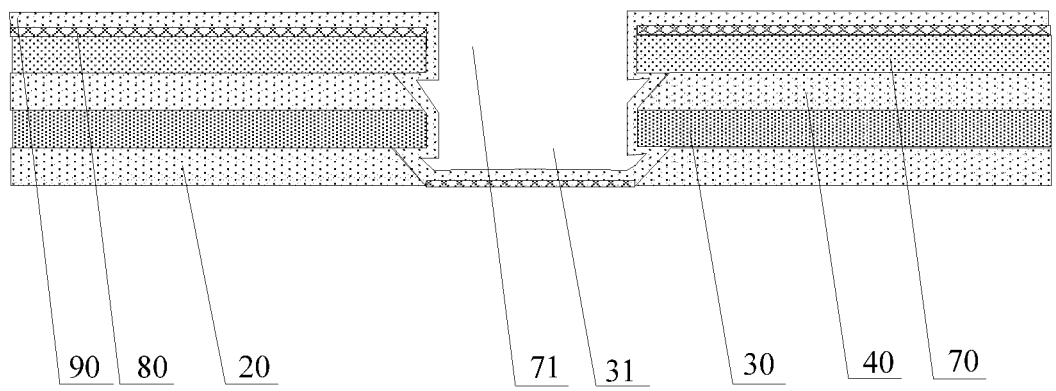
FIG. 22 is a schematic structural diagram of a flexible display substrate according to an embodiment of the present disclosure.

As shown in FIGS. 22 and 18, an embodiment of the present disclosure further provides a flexible display substrate, including a flexible substrate, a thin film transistor layer, an organic light emitting layer, and an encapsulation thin film layer which are sequentially arranged from the bottom to the top. The flexible substrate includes multiple island regions spaced apart and multiple bridge regions connected between different island regions, and has multiple openings in regions which are neither island regions nor bridge regions. Multiple layer structures are arranged on each island region. The layer structures include a first flexible base substrate layer 20, a first buffer layer 30, and a second flexible base substrate layer 40 which are sequentially stacked from the bottom to the top. An orthographic projection of a surface of the first buffer layer 30 facing the first flexible base substrate layer 20 on the first flexible base substrate layer 20 is larger than that of a surface of the first flexible base substrate layer 20 facing the first buffer layer 30 on the first flexible base substrate layer 20.

In an exemplary embodiment, a junction surface of the opening (i.e., the first via hole 31 in FIG. 19) and the first flexible base substrate layer 20 is a slope surface. An orthographic projection of a surface of the first flexible base substrate layer 20 away from the first buffer layer 30 on the first flexible base substrate layer 20 is larger than that of the surface of the first flexible base substrate layer 20 facing the first buffer layer 30 on the first flexible base substrate layer 20.

In an exemplary embodiment, a junction surface of the opening and the second flexible base substrate layer 40 is a slope surface. An orthographic projection of a surface of the second flexible base substrate layer 40 facing the first buffer layer 30 on the first flexible base substrate layer 20 is larger than that of a surface of the second flexible base substrate layer 40 away from the first buffer layer 30 on the first flexible base substrate layer 20.

In an exemplary embodiment, inter-penetrating via holes are formed on the first flexible base substrate layer, the first buffer layer, the second flexible base substrate layer, and a thin film transistor layer. Positions of the via holes correspond to those of the openings.

In an exemplary embodiment, the layer structures further include a second buffer layer and a third flexible base substrate layer.

The second buffer layer is arranged on a side of the second flexible base substrate layer 40 away from the first buffer layer 30.

The third flexible base substrate layer is arranged on a side of the second buffer layer away from the second flexible base substrate layer 40. An orthographic projection of a surface of the second buffer layer facing the second flexible base substrate layer 40 on the first flexible base substrate layer 20 is larger than that of a surface of the second flexible base substrate layer 40 facing the second buffer layer on the first flexible base substrate layer 20.

In an exemplary embodiment, inter-penetrating via holes are formed on the first flexible base substrate layer, the first buffer layer, the second flexible base substrate layer, the second buffer layer, the third flexible base substrate layer, and the thin film transistor layer. Positions of the via holes correspond to those of the openings.

In some exemplary embodiments, the encapsulation thin film layer covers a surface of the organic light emitting layer away from the first flexible base substrate layer and sidewalls of the first flexible base substrate layer, the first buffer layer, the second flexible base substrate layer, and the thin film transistor layer at the side close to the opening.

An embodiment of the present disclosure further provides a display device, which includes the abovementioned flexible substrate or the abovementioned flexible display substrate.

The following points need to be noted.

The drawings of the embodiments of the present disclosure only involve the structures involved in the embodiments of the present disclosure, and the other structures may refer to conventional designs.

The embodiments in the present disclosure, i.e., the features in the embodiments, may be combined with each other if there is conflict to obtain new embodiments.

Although the implementation modes of the present disclosure are disclosed above, the contents are only implementation modes used to facilitate understanding the present disclosure and not intended to limit the present disclosure. Those skilled in the art may make any modifications and variations to implementation forms and details without departing from the essence and scope disclosed by the present disclosure. However, the patent protection scope of the present disclosure shall still be subject to the scope defined by the appended claims.

What is claimed is:

1. A flexible substrate, comprising a plurality of island regions spaced apart and a plurality of bridge regions connected between different island regions and having a plurality of openings in regions which are neither the island regions nor the bridge regions, wherein a plurality of layer structures are arranged on each island region, the layer structures comprise a first flexible base substrate layer, a first buffer layer, and a second flexible base substrate layer which are sequentially arranged from bottom to top, and an orthographic projection of a surface of the first buffer layer facing the first flexible base substrate layer on the first flexible base substrate layer is larger than an orthographic projection of a surface of the first flexible base substrate layer facing the first buffer layer on the first flexible base substrate layer.

2. The flexible substrate according to claim 1, wherein a junction surface of an opening and the first flexible base substrate layer is a slope surface, and an orthographic projection of a surface of the first flexible base substrate layer away from the first buffer layer on the first flexible base substrate layer is larger than an orthographic projection of the surface of the first flexible base substrate layer facing the first buffer layer on the first flexible base substrate layer.

3. The flexible substrate according to claim 1, wherein a junction surface of an opening and the second flexible base substrate layer is a slope surface, and an orthographic projection of a surface of the second flexible base substrate layer facing the first buffer layer on the first flexible base substrate layer is larger than an orthographic projection of a surface of the second flexible base substrate layer away from the first buffer layer on the first flexible base substrate layer.

4. The flexible substrate according to claim 1, wherein inter-penetrating via holes are formed on the first flexible base substrate layer, the first buffer layer, and the second flexible base substrate layer, and positions of the via holes correspond to those of the openings.

5. The flexible substrate according to claim 1, wherein a material of the first buffer layer is silicon oxide, silicon nitride, aluminium oxide, or silicon oxynitride.

6. The flexible substrate according to claim 1, wherein the layer structures further comprise a second buffer layer and a third flexible base substrate layer, wherein
the second buffer layer is arranged on a side of the second flexible base substrate layer away from the first buffer layer; and
the third flexible base substrate layer is arranged on a side of the second buffer layer away from the second flexible base substrate layer, and an orthographic projection of a surface of the second buffer layer facing the second flexible base substrate layer on the first flexible base substrate layer is larger than an orthographic projection of a surface of the second flexible base substrate layer facing the second buffer layer on the first flexible base substrate layer.

7. The flexible substrate according to claim 6, wherein inter-penetrating via holes are formed on the first flexible base substrate layer, the first buffer layer, the second flexible base substrate layer, the second buffer layer, and the third flexible base substrate layer, and positions of the via holes correspond to those of the openings.

8. The flexible substrate according to claim 6, wherein a material of the second buffer layer is silicon oxide, silicon nitride, aluminium oxide, or silicon oxynitride.

9. The flexible substrate according to claim 2, wherein a material of the first buffer layer is silicon oxide, silicon nitride, aluminium oxide, or silicon oxynitride.

10. The flexible substrate according to claim 3, wherein a material of the first buffer layer is silicon oxide, silicon nitride, aluminium oxide, or silicon oxynitride.

11. The flexible substrate according to claim 4, wherein a material of the first buffer layer is silicon oxide, silicon nitride, aluminium oxide, or silicon oxynitride.

12. The flexible substrate according to claim 7, wherein a material of the second buffer layer is silicon oxide, silicon nitride, aluminium oxide, or silicon oxynitride.

13. A flexible display substrate, comprising a flexible substrate, a thin film transistor layer, an organic light emitting layer, and an encapsulation thin film layer which are sequentially arranged from bottom to top, wherein the flexible substrate comprises a plurality of island regions spaced apart and a plurality of bridge regions connected between different island regions, and has a plurality of openings in regions which are neither the island regions nor the bridge regions, a plurality of layer structures are arranged on each island region, the layer structures comprise a first flexible base substrate layer, a first buffer layer, and a second flexible base substrate layer which are sequentially stacked from bottom to top, and an orthographic projection of a surface of the first buffer layer facing the first flexible base substrate layer on the first flexible base substrate layer is larger than an orthographic projection of a surface of the first flexible base substrate layer facing the first buffer layer on the first flexible base substrate layer.

14. The flexible display substrate according to claim 13, wherein the encapsulation thin film layer covers a surface of the organic light emitting layer away from the first flexible base substrate layer and sidewalls of the first flexible base substrate layer, the first buffer layer, the second flexible base substrate layer, and the thin film transistor layer at a side close to the opening.

15. A method for manufacturing a flexible substrate, comprising:
sequentially forming a first flexible base substrate layer and a first buffer layer on a rigid underlaying substrate, and forming a first via hole on the first buffer layer;
processing the first flexible base substrate layer to make the first via hole penetrate through the first flexible base substrate layer, wherein an orthographic projection of a surface of the first buffer layer facing the first flexible base substrate layer on the rigid underlaying substrate is larger than an orthographic projection of a surface of the first flexible base substrate layer facing the first buffer layer on the rigid underlaying substrate;
forming a second flexible base substrate layer on a side of the first buffer layer away from the first flexible base substrate layer;
processing the second flexible base substrate layer to make the first via hole penetrate through the second flexible base substrate layer; and
lifting off the rigid underlaying substrate to obtain the flexible substrate.

16. The method according to claim 15, wherein when the first flexible base substrate layer is processed, the method further enables that a junction surface of the first via hole and the first flexible base substrate layer is a slope surface and an orthographic projection of a surface of the first flexible base substrate layer facing the rigid underlaying substrate on the rigid underlaying substrate is larger than an orthographic projection of a surface of the first flexible base substrate layer away from the rigid underlaying substrate on the rigid underlaying substrate; and
when the second flexible base substrate layer is processed, the method further enables that a junction surface of the first via hole and the second flexible base substrate layer is a slope surface and an orthographic projection of a surface of the second flexible base substrate layer facing the first buffer layer on the rigid underlaying substrate is larger than an orthographic projection of a surface the second flexible base substrate layer away from the first buffer layer on the rigid underlaying substrate.

17. The method according to claim 15, wherein before processing the second flexible base substrate layer, the method further comprises: forming a second buffer layer on a side of the second flexible base substrate layer away from the first buffer layer, forming a second via hole having a position corresponding to that of the first via hole on the second buffer layer, wherein
processing the second flexible base substrate layer to make the first via hole penetrate through the second flexible base substrate layer comprises: processing the second flexible base substrate layer to make the first via hole and the second via hole communicated with each other and penetrate through the second flexible layer, with an orthographic projection of a surface of the second buffer layer facing the second flexible base substrate layer on the rigid underlaying substrate being larger than an orthographic projection of a surface of the second flexible base substrate layer facing the second buffer layer on the rigid underlaying substrate;
forming a third flexible base substrate layer on a side of the second buffer layer away from the second flexible base substrate layer; and processing the third flexible base substrate layer to make the first via hole and the second via hole communicated with each other and penetrate through the third flexible base substrate layer.

18. The method according to claim 15, before processing the second flexible base substrate layer, the method further comprises: forming a thin film transistor layer on a side of the second flexible base substrate layer away from the first buffer layer, forming a third via hole having a position corresponding to that of the first via hole on the thin film transistor layer, wherein
processing the second flexible base substrate layer to make the first via hole penetrate through the second flexible base substrate layer comprises: processing the second flexible base substrate layer to make the first via hole and the third via hole communicated with each other and penetrate through the first flexible base substrate layer and the second flexible base substrate layer; and sequentially forming an organic light emitting layer and an encapsulation thin film layer on the thin film transistor layer.

19. The method according to claim 18, wherein when the second flexible base substrate layer is processed, the method further enables that an orthographic projection of a surface of the thin film transistor layer facing the second flexible substrate on the rigid underlaying substrate is larger than an orthographic projection of a surface of the second flexible base substrate layer facing the thin film transistor layer on the rigid underlaying substrate.

20. The method according to claim 18, wherein the organic light emitting layer is formed on the thin film transistor layer through an evaporation process; and
the encapsulation thin film layer is formed on the organic light emitting layer through a Chemical Vapor Deposition (CVD) or sputtering process.

* * * * *